US012506244B2

(12) United States Patent
Gerfault et al.

(10) Patent No.: US 12,506,244 B2
(45) Date of Patent: Dec. 23, 2025

(54) POWER COMBINER SYSTEM COMPRISING FOUR SOLID-STATE MICROWAVE POWER AMPLIFIERS

(71) Applicant: THALES, Courbevoie (FR)

(72) Inventors: Bertrand Gerfault, Jouy en Josas (FR); James Belluot, Versailles (FR)

(73) Assignee: THALES, Courbevoie (FR)

( * ) Notice: Subject to any disclaimer, the term of this patent is extended or adjusted under 35 U.S.C. 154(b) by 469 days.

(21) Appl. No.: 18/008,930

(22) PCT Filed: Jun. 9, 2021

(86) PCT No.: PCT/EP2021/065508

§ 371 (c)(1),
(2) Date: Dec. 7, 2022

(87) PCT Pub. No.: WO2021/250118

PCT Pub. Date: Dec. 16, 2021

(65) Prior Publication Data

US 2023/0231292 A1 Jul. 20, 2023

(30) Foreign Application Priority Data

Jun. 11, 2020 (FR) ...................................... 2006098

(51) Int. Cl.
*H01P 5/20* (2006.01)
*H03F 3/189* (2006.01)

(52) U.S. Cl.
CPC ............... *H01P 5/20* (2013.01); *H03F 3/189* (2013.01)

(58) Field of Classification Search
CPC .... H01P 5/12; H01P 5/16; H01P 5/107; H01P 5/103; H01P 5/18; H01P 5/20; H01P 5/184; H01P 5/024; H01P 5/08; H01P 5/10; H01P 5/183; H01P 5/04; H03F 3/189
See application file for complete search history.

(56) References Cited

U.S. PATENT DOCUMENTS

| | | | | |
|---|---|---|---|---|
| 9,065,163 | B1 * | 6/2015 | Wu | H03F 3/211 |
| 10,340,574 | B2 | 7/2019 | Mohan et al. | |
| 2011/0002031 | A1 | 1/2011 | Fraysse et al. | |
| 2011/0260771 | A1 * | 10/2011 | Hirota | H04B 1/0483 327/360 |
| 2016/0359460 | A1 * | 12/2016 | Garuti | H03F 3/211 |
| 2018/0145395 | A1 * | 5/2018 | Ju | H01P 5/184 |

FOREIGN PATENT DOCUMENTS

| | | | |
|---|---|---|---|
| EP | 0 491 505 | A2 | 6/1992 |
| EP | 2 869 396 | A1 | 5/2015 |
| EP | 3 404 766 | A1 | 11/2018 |

OTHER PUBLICATIONS

Bonnet, "Combinaison de puissance hyperfréquence à faibles pertes et compacte" (Combination of microwave to low power losses and compact), Electronique, Université de Limoges, 2014.

* cited by examiner

*Primary Examiner* — John W Poos
(74) *Attorney, Agent, or Firm* — BakerHostetler

(57) ABSTRACT

A power combiner system includes four microwave solid-state power amplifiers, which are connected in an H configuration by a magic tee device.

5 Claims, 2 Drawing Sheets

POWER COMBINER SYSTEM COMPRISING FOUR SOLID-STATE MICROWAVE POWER AMPLIFIERS

CROSS-REFERENCE TO RELATED APPLICATIONS

This application is a National Stage of International patent application PCT/EP2021/065508, filed on Jun. 9, 2021, which claims priority to foreign French patent application No. FR 2006098, filed on Jun. 11, 2020, the disclosures of which are incorporated by reference in their entirety.

FIELD OF THE INVENTION

The invention bears on a solid-state microwave power amplifier and a power combiner comprising four such solid-state amplifiers.

The invention lies in the field of microwave solid-state power amplifiers (SSPAs).

BACKGROUND

Spatial- or conventional-combination amplification systems, such as SSPAs and traveling-wave tube amplifiers (TWTAs), are known, which all have major drawbacks.

Specifically, these amplification systems have compactness, yield, repair, maintainability, assembly, assembly and upgrade cost, upgradability and power-limitation problems.

Tube amplifiers or traveling-wave tube amplifiers (TWTAs) which use a heated filament are known, which liberate electrons by thermionic emission. These electrons are then accelerated in vacuum by means of a high-intensity electric field generated by a very high voltage (VHV). Once accelerated, these electrons are focused into a beam which interacts with a microwave. Gradually, the direct-current or DC energy contained in the electron beam is converted little by little into microwave energy as the electrons travel along the interaction line. This energy is then transmitted out of the tube while the residual energy is transmitted to the collector and dissipated as heat.

These amplifiers have a good capacitance and a high yield, but operate in an all-or-nothing fashion and, in the event of a failure, the product is out of use. They require a very high voltage (VHV), are highly technical in nature, and are very expensive to produce and very difficult to maintain.

Monolithic solid-state amplifiers (SSPAs) which are combined spatially by means of antipodal lines of Vivaldi type which will then radiate into cavities are also known.

These cavities constitute input points of a conical-cavity combiner. This type of amplifier, described, for example, in the document U.S. Pat. No. 10,340,574 B2, have good compactness, fairly low losses, and an absence of inter-stage interconnection problems. However, they have a radial combination which makes managing heat dissipation very complicated and optimal pulsed-mode operation complicated, almost impossible, as the energy reserve capacitors cannot be placed as close as possible to the monolithic microwave integrated circuits (MMICs).

Hybrid-combination or T-configuration solid-state amplifiers (SSPAs), in which monolithic microwave integrated circuits (MMICs) are combined by means of hybrid, Wilkinson or T-junction couplers, are also known.

Such amplifiers are relatively inexpensive but do, however, have relatively high losses, lack upgradability potential (power limitation), and are very difficult to repair because of the assembly of chip-and-wire type.

None of the aforementioned existing solutions is therefore satisfactory as they all have major defects.

The thesis document 2014LIMO0072 is also known, which discloses known coupling techniques, and notably:

- a Wilkinson combiner, the power of which is limited by the traces and the gentle degradation of which is not possible as it is very difficult to cool the balance resistors which are not referenced to ground. Gentle degradation makes it possible for a solid-state amplifier to continue to operate, and therefore deliver power, when one of the amplifiers has failed. However, in order for it to be able to operate, the output power combination must provide isolation between the paths. The signal from a first amplifier must not be redirected toward a second amplifier. This isolation is further provided by the balance resistors. In addition, these resistors must be sized by power capacity in order to hold half the power of a path. They must therefore be cooled perfectly;
- a Gisel combiner, the power of which is limited by the traces and the width of its passband is limited;
- a radial combiner, the volume of which is large as the output of the microwave signal is not in the same plane as the inputs; and
- a spatial combiner, the volume of which is large and which is difficult to cool as it is circular and the heat sources (transistors) are not on the same plane.

SUMMARY OF THE INVENTION

One aim of the invention is to mitigate the aforementioned problems, and notably to improve repairability, compactness and upgradability.

Thus, what is proposed, according to one aspect of the invention, is a power combiner system comprising four microwave solid-state power amplifiers, which are connected in an H configuration by a monobloc magic tee device, in which the monobloc magic tee device comprises an S-clamp and a base comprising an integrated lower portion of the magic tee device.

Such a power combiner system has improved repairability, compactness and upgradability.

Thus, by virtue of the monobloc aspect, manufacturing it is made easier and has a limited cost. It is also easier to cool as all the elements are in the same plane and are to be mechanically and thermally connected to the heat sink.

The S-clamp makes it possible for the magic T2 to be connected directly to a standard connection clamp of WRD650 type.

The base comprising an integrated lower portion of the magic tee device improves heat management, simplifies assembly and improves compactness and power yield because of the low losses.

In one embodiment, the power combiner system comprises a base comprising a bidirectional coupler.

Such an embodiment improves heat management, simplifies assembly and improves compactness and power yield because of the low losses.

According to one embodiment, the base comprises an integrated lower portion of the bidirectional coupler.

Thus, the directional coupler is completely integrated in space without adding volume to the system. The connection is made directly in the guide without interconnection components and therefore without energy loss.

In one embodiment, the power combiner system comprises a preamplifier module configured to amplify and divide the microwave signal identically toward the four solid-state amplifiers.

The preamplifier module is integrated without losing volume and the management of the precision of the (amplitude and phase) division may be controlled electronically and digitally at the level of this module.

According to one embodiment, the amplifiers, the magic tee device, the bidirectional coupler and the driver module are mounted flat on the base.

The flat mounting configuration of the elements of the combiner system makes it easy to manage heat and multi-mission constraints.

In one embodiment, the flat mounting comprises screws.

The flat mounting makes it possible to limit the thermal interfaces between the hot spots and the cold plate, which ensures the assembly is cooled. This also makes it possible to have easy access to all the subassemblies and therefore improves repairability.

BRIEF DESCRIPTION OF THE DRAWINGS

The invention will be better understood on studying a few embodiments that are described by way of completely non-limiting examples and illustrated by the appended drawing, in which.

Throughout the figures, elements having identical references are similar.

DETAILED DESCRIPTION

Figure 1:
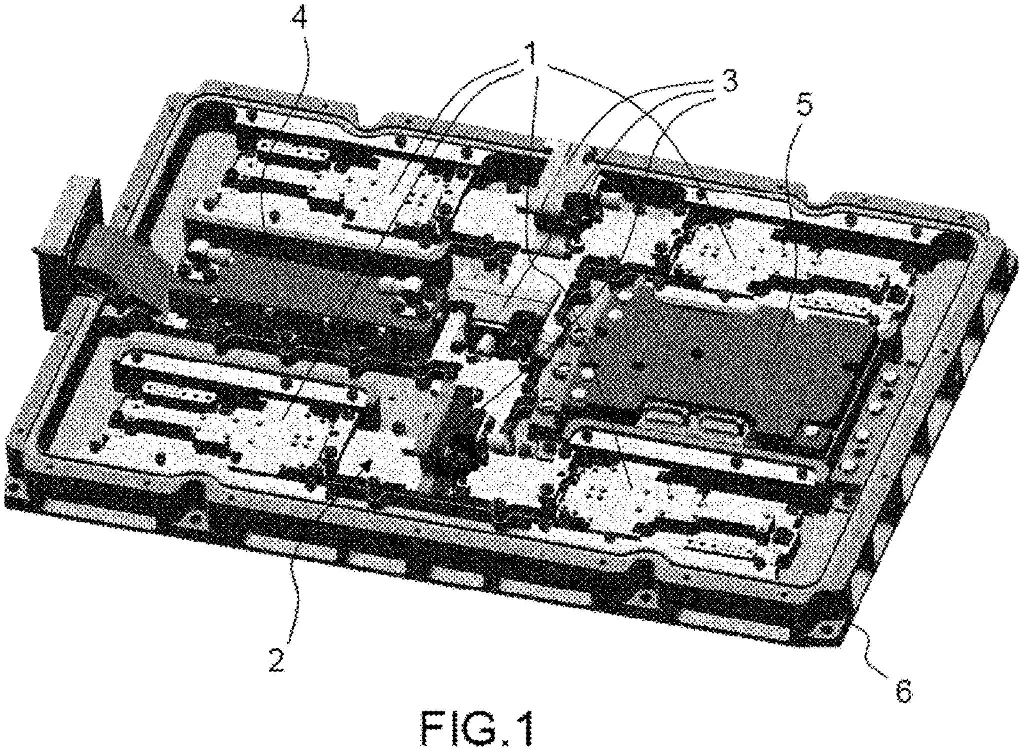
FIG. 1 schematically illustrates a microwave solid-state power amplifier, according to one aspect of the invention.

FIG. 1 illustrates, according to one aspect of the invention, a power combiner system comprising four microwave solid-state power amplifiers 1, which are connected in an H configuration by a magic tee device 2.

The magic tee device 2, referred to as a 4-to-1 (4 inputs/1 output), comprises, for example, three combiners referred to as two-to-one and four coaxial transitions. The power combiner system also comprises a bidirectional coupler 4.

The bidirectional coupler 4 is a microwave element which is composed of four ports. It therefore comprises a first, input port, a second, output (transmission) port, a third port for measuring, by coupling, the microwave which propagates from the first, input port to the second, output port (incident wave) and a fourth port for measuring, by coupling, the wave which propagates from the second port toward the first port (reflected wave). The coupling is the coefficient for sampling the wave between the four ports. When a −20 dB directional coupler is spoken of, for example, that means that the coupling of the wave is 1/100 of the main wave. The isolation port is also spoken of as, when the wave propagates from the first port to the second port, there is no coupling in the fourth port; it is isolated.

The combiner system further comprises a driver module 5, used to amplify and divide the microwave signal toward four paths (one path per microwave power amplifier 1). The four paths must be rigorously identical for the summation by the output combiner to be made with minimum power losses.

The combiner system also comprises a housing 6 which accommodates and protects the elements of the system, and a cover, which is not shown, may make it possible to close and finish protecting the system.

The H configuration of the combiner system makes it possible to optimize the footprint as well as the distribution of the hot spots.

The magic tee device 2, the bidirectional coupler 4 and the preamplifier module 5 may be mounted flat on a base, in this instance the housing 6. The flat mounting may comprise screws. The flat mounting configuration of the elements of the combiner system makes it easy to manage heat and multi-mission constraints. Specifically, reservoir capacitors may then be as close as possible to the microwave solid-state power amplifiers 1 for the pulsed mode as, for the power to remain constant during the pulse capacitors with high values (mF), therefore large ones, are required. Having a flat structure makes them easier to integrate.

At least one solid-state amplifier 1 may comprise at least one interconnection, between a microtrace and a suitable waveguide impedance edge, equipped with a clamping device. The microtrace transitions toward a double-edged waveguide with non-standard impedance transformation make optimal compactness without a transition possible; losses are therefore limited and yield improved.

Figure 2:
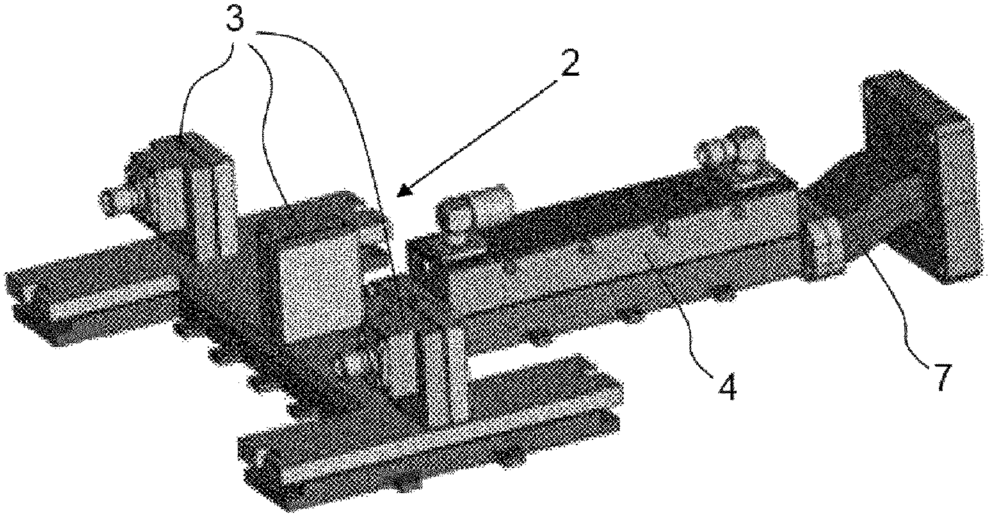
FIG. 2 schematically illustrates a microwave solid-state power amplifier, according to another aspect of the invention.

FIG. 2 illustrates the magic tee device 2, comprising three two-to-one combiners 3, the bidirectional coupler 4 and an S-clamp 7.

The microwave power amplifiers 1 and the magic tee device 2 are assembled and disassembled very easily merely by screwing. Maintenance and repair operations are thus greatly facilitated.

The interconnections of the combiner system are not hyperstatic.

The modular design makes upgradability at a lower cost, in addition to easy maintainability, possible.

The combiner system offers isolation between paths, which makes it possible to maintain the gentle degradation performance. The isolation between the paths is provided by the balance resistors of the magic T. These resistors must be able, if one microwave power amplifier becomes defective, to tolerate half of the power of another microwave power amplifier. They must therefore be able to be cooled and therefore mechanically and thermally connected to the cold plate.

Figure 3:
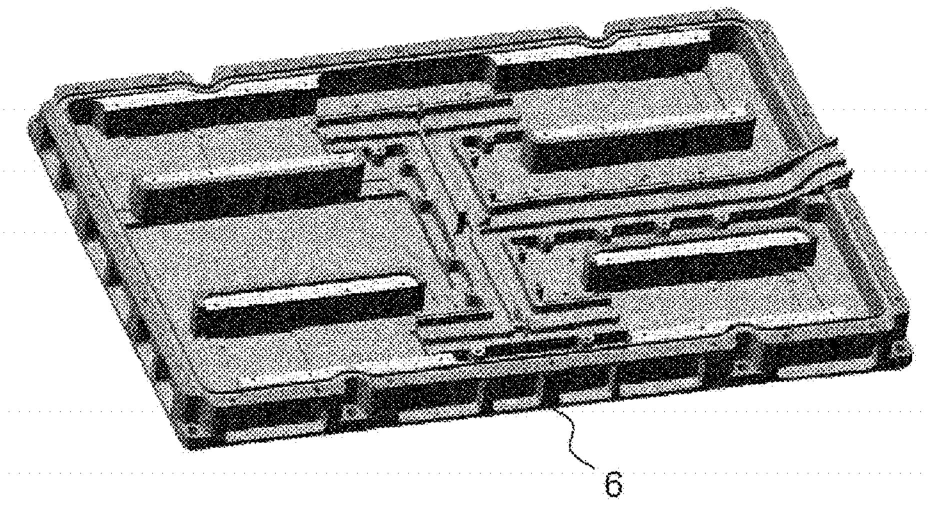
FIG. 3 schematically illustrates a microwave solid-state power amplifier, according to another aspect of the invention.

FIG. 3 illustrates one embodiment in which the base 6 comprises an integrated lower portion of the magic tee device 2. Furthermore, the base 6 may comprise an integrated lower portion of the bidirectional coupler 4.

Figure 4:
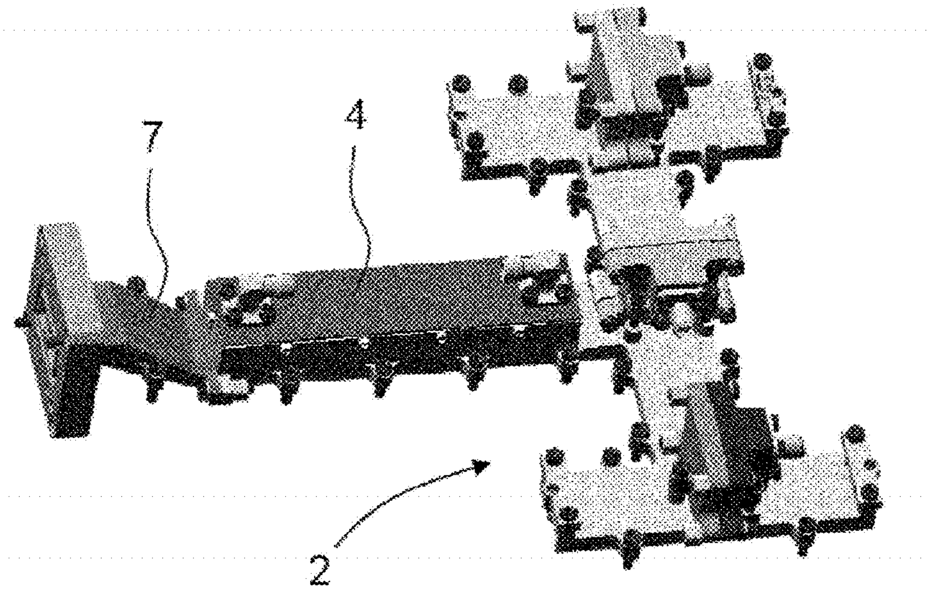
FIG. 4 schematically illustrates a microwave solid-state power amplifier, according to FIG. 3.

FIG. 4 illustrates, in the embodiment of FIG. 3, the upper portion, screwed to the base 6, of the magic tee device 2 and of the bidirectional coupler 4.

Thus, the combiner system offers excellent heat management, simple assembly and great compactness, and makes it possible to maintain optimal power yield because of the low losses.

The invention claimed is:

1. A power combiner system comprising four microwave solid-state power amplifiers, which are connected in an H configuration by a monobloc magic tee device, wherein the monobloc magic tee device comprises an S-clamp and a base comprising an integrated lower portion of the magic tee device, and further comprising a bidirectional coupler.

2. The power combiner system as claimed in claim 1, wherein the base comprises an integrated lower portion of the bidirectional coupler.

3. The power combiner system as claimed in claim 1, comprising a preamplifier module configured to amplify and divide the microwave signal identically toward the four solid-state amplifiers.

4. The power combiner system as claimed in claim 3, wherein the solid-state amplifiers, the magic tee device, the bidirectional coupler and the preamplifier module are mounted flat on the base.

5. The power combiner system as claimed in claim 4, wherein the flat mounting comprises screws.

* * * * *